United States Patent
Lu et al.

(10) Patent No.: US 10,854,521 B2
(45) Date of Patent: *Dec. 1, 2020

(54) LOW-K GATE SPACER AND FORMATION THEREOF

(71) Applicant: Taiwan Semiconductor Manufacturing Co., Ltd., Hsinchu (TW)

(72) Inventors: Bo-Cyuan Lu, New Taipei (TW); Chunyao Wang, Zhubei (TW); Jr-Hung Li, Chupei (TW); Chung-Ting Ko, Kaohsiung (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/674,443

(22) Filed: Nov. 5, 2019

(65) Prior Publication Data
US 2020/0075419 A1  Mar. 5, 2020

Related U.S. Application Data

(60) Continuation of application No. 16/203,814, filed on Nov. 29, 2018, now Pat. No. 10,510,612, which is a
(Continued)

(51) Int. Cl.
*H01L 29/66* (2006.01)
*H01L 21/8234* (2006.01)
(Continued)

(52) U.S. Cl.
CPC ........... *H01L 21/823468* (2013.01); *H01L 21/823431* (2013.01); *H01L 27/0886* (2013.01);
(Continued)

(58) Field of Classification Search
CPC .......... H01L 29/66545; H01L 29/6656; H01L 29/66795; H01L 29/41791; H01L 29/785;
(Continued)

(56) References Cited

U.S. PATENT DOCUMENTS 7,670,894 B2 * 3/2010 Rachmady ............ H01L 21/312
438/216
8,637,359 B2 * 1/2014 Chang ............... H01L 29/66545
257/347

(Continued)

FOREIGN PATENT DOCUMENTS

KR  20160137305 A  11/2016
KR  20170013796 A   2/2017
WO  2016138284 A1   9/2016

*Primary Examiner* — Michael M Trinh
(74) *Attorney, Agent, or Firm* — Slater Matsil, LLP

(57) ABSTRACT

Gate structures and gate spacers, along with methods of forming such, are described. In an embodiment, a structure includes an active area on a substrate, a gate structure on the active area and over the substrate, and a low-k gate spacer on the active area and along a sidewall of the gate structure. The gate structure includes a conformal gate dielectric on the active area and includes a gate electrode over the conformal gate dielectric. The conformal gate dielectric extends vertically along a first sidewall of the low-k gate spacer. In some embodiments, the low-k gate spacer can be formed using a selective deposition process after a dummy gate structure has been removed in a replacement gate process.

20 Claims, 10 Drawing Sheets

Related U.S. Application Data division of application No. 15/833,912, filed on Dec. 6, 2017, now Pat. No. 10,483,168.

(60) Provisional application No. 62/586,529, filed on Nov. 15, 2017.

(51) Int. Cl.
  *H01L 27/088* (2006.01)
  *H01L 29/423* (2006.01)
  *H01L 29/417* (2006.01)
  *H01L 29/78* (2006.01)

(52) U.S. Cl.
  CPC .. *H01L 29/41775* (2013.01); *H01L 29/42364* (2013.01); *H01L 29/6656* (2013.01); *H01L 29/66545* (2013.01); *H01L 29/66553* (2013.01); *H01L 29/66795* (2013.01); *H01L 29/785* (2013.01); *H01L 29/7851* (2013.01); *H01L 29/41791* (2013.01); *H01L 29/7848* (2013.01)

(58) Field of Classification Search
  CPC ........... H01L 29/66553; H01L 29/7851; H01L 29/41775; H01L 29/42364; H01L 29/7848; H01L 21/823468; H01L 21/823431; H01L 21/02277; H01L 21/0228; H01L 27/0886; H01L 27/0924; H01L 21/02312; H01L 21/02315; H01L 21/02271; H01L 21/02274

See application file for complete search history.

(56) References Cited

U.S. PATENT DOCUMENTS

| | | | |
|---|---|---|---|
| 8,709,541 | B2 | 4/2014 | Matsumoto et al. |
| 8,835,213 | B2 * | 9/2014 | Mieno ................ H01L 21/0228 257/E21.411 |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,287,403 | B1 | 3/2016 | Lee et al. |
| 9,472,628 | B2 * | 10/2016 | Cheng ................... H01L 29/267 |
| 9,520,482 | B1 | 12/2016 | Chang et al. |
| 9,536,980 | B1 | 1/2017 | Huang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 10,483,168 | B2 * | 11/2019 | Lu ....................... H01L 27/0886 |
| 2013/0187229 | A1 | 7/2013 | Cheng et al. |
| 2014/0369115 | A1 | 12/2014 | Kim et al. |
| 2015/0076606 | A1 | 3/2015 | Cheng et al. |
| 2015/0162445 | A1 * | 6/2015 | Wu ...................... H01L 29/7848 257/344 |
| 2015/0263120 | A1 | 9/2015 | Xie et al. |
| 2016/0020110 | A1 | 1/2016 | Lu et al. |
| 2016/0233084 | A1 * | 8/2016 | Chen ................. H01L 21/02126 |
| 2016/0233337 | A1 | 8/2016 | Basker et al. |
| 2017/0179123 | A1 | 6/2017 | Chang et al. |
| 2017/0200808 | A1 | 7/2017 | Zhang et al. |
| 2018/0047754 | A1 | 2/2018 | Basker et al. |
| 2018/0175029 | A1 | 6/2018 | Ching et al. |

\* cited by examiner

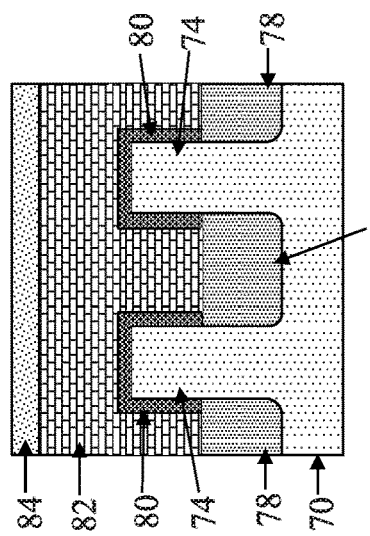
FIG. 6A
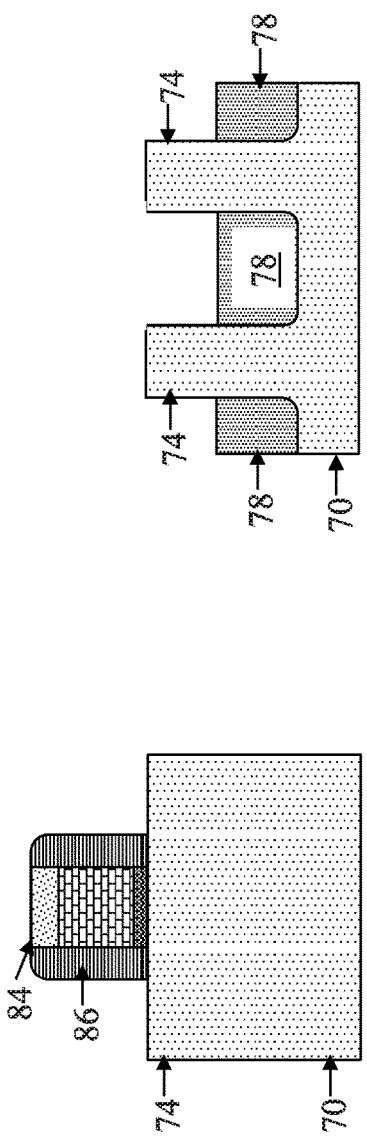
FIG. 6B
FIG. 6C
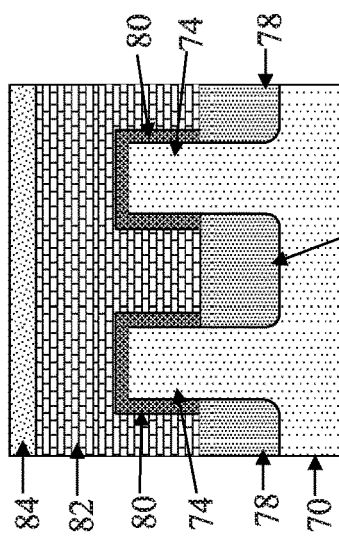
FIG. 7A
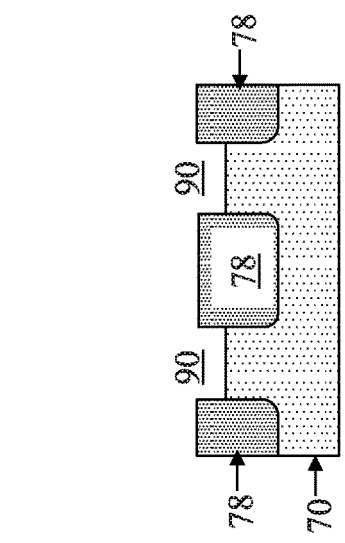
FIG. 7B
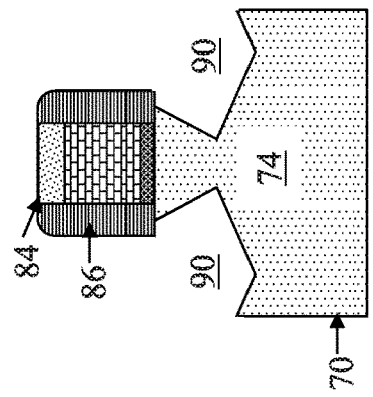
FIG. 7C

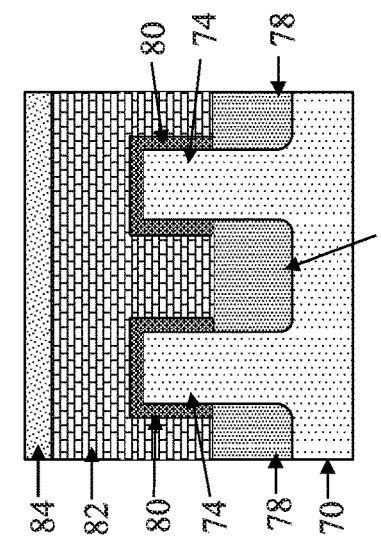
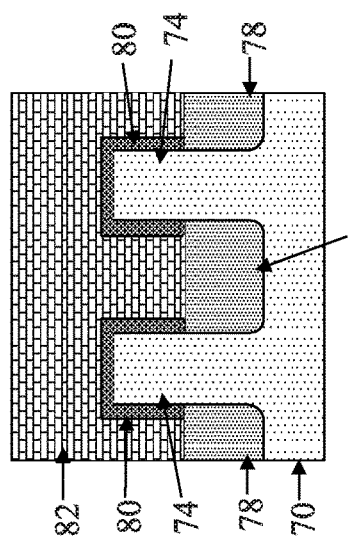
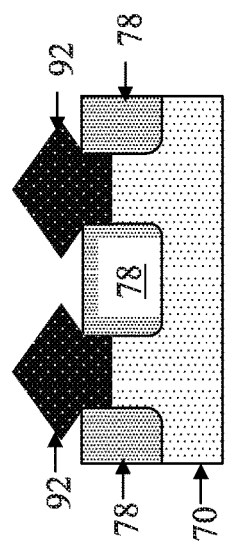
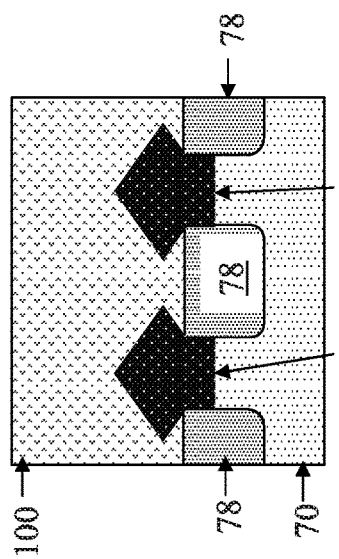
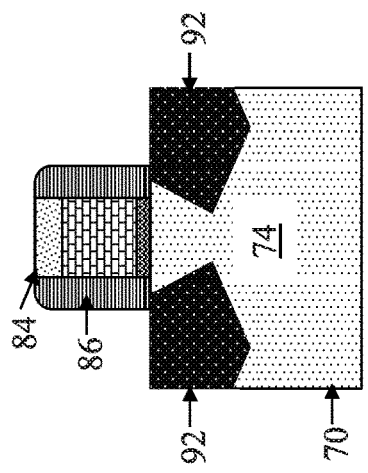
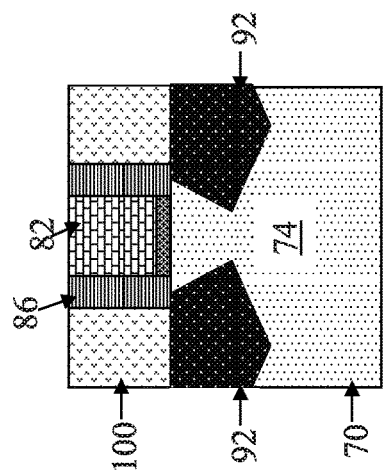

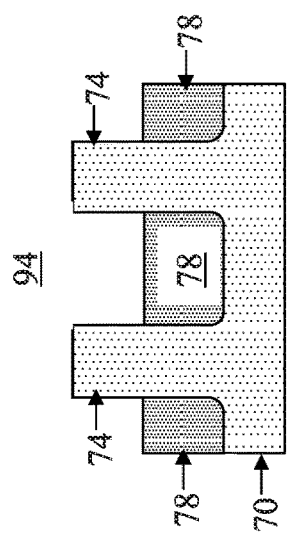 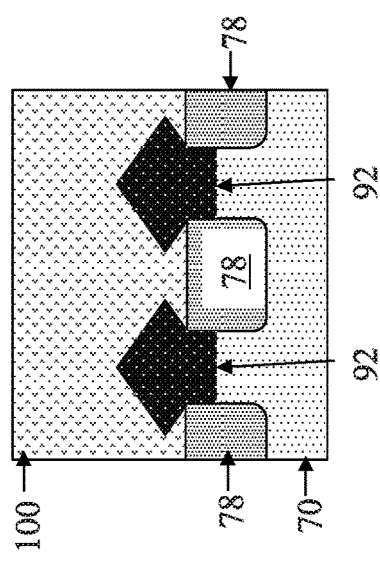 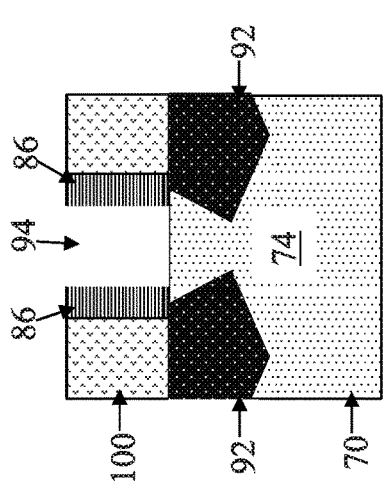
FIG. 10A  FIG. 10B  FIG. 10C
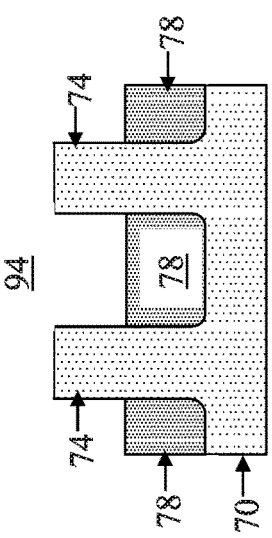 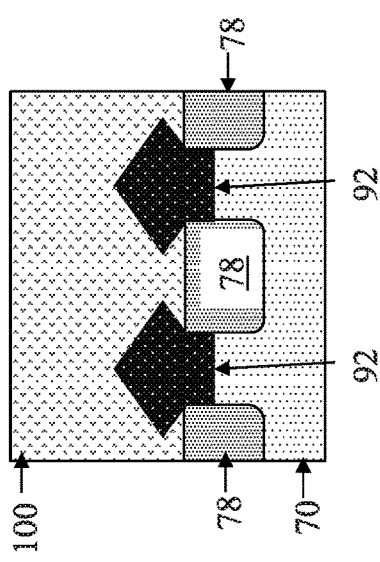 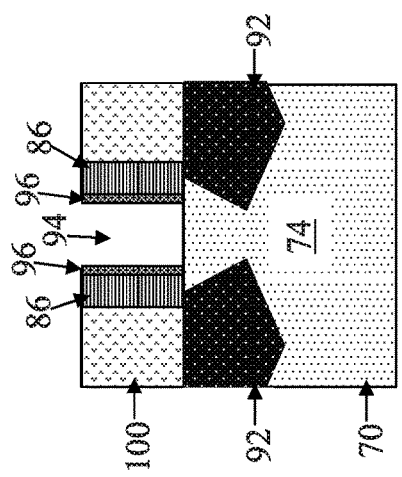
FIG. 11A  FIG. 11B  FIG. 11C

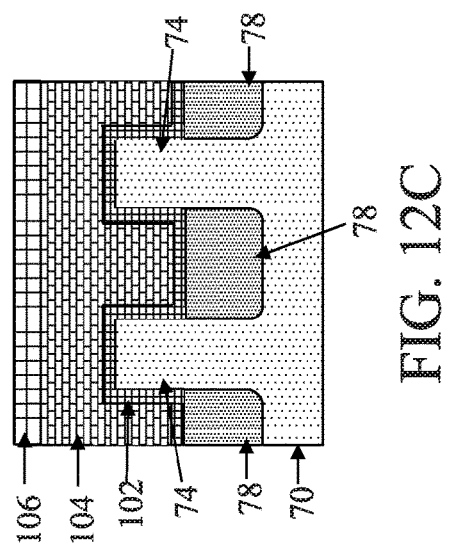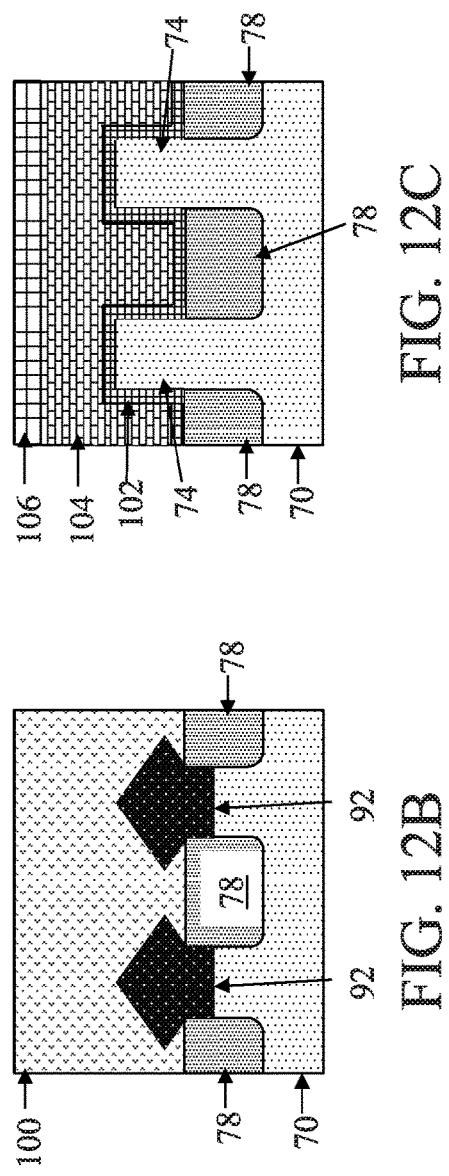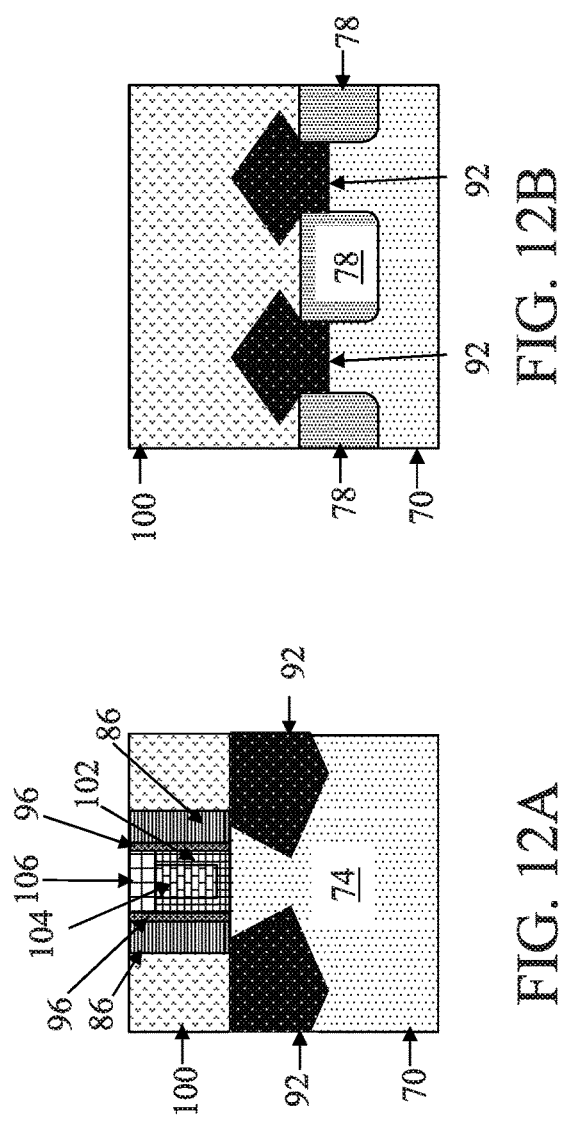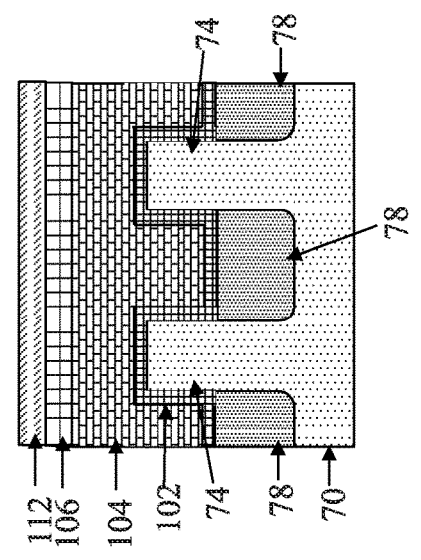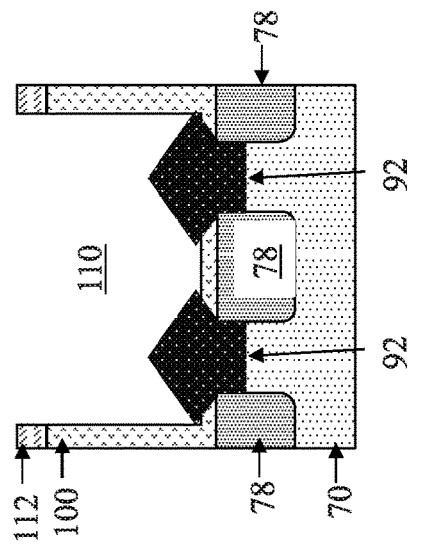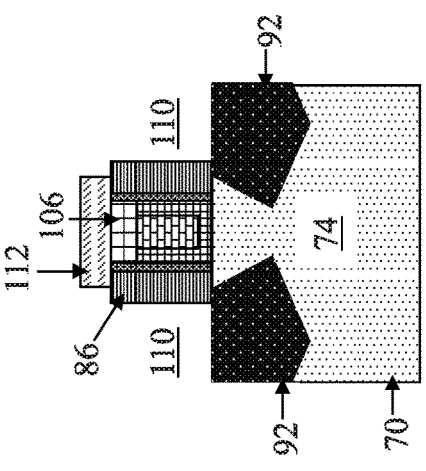

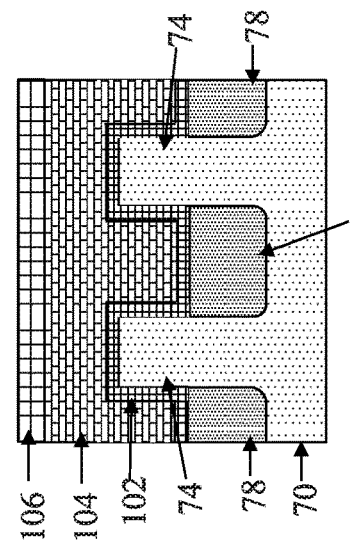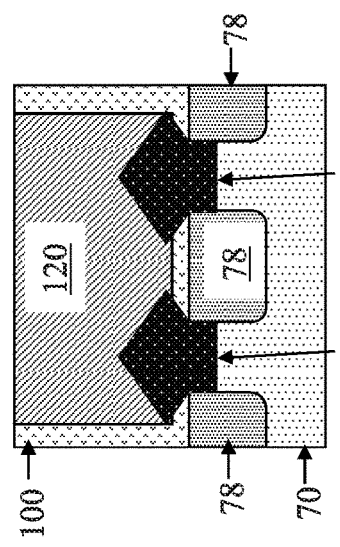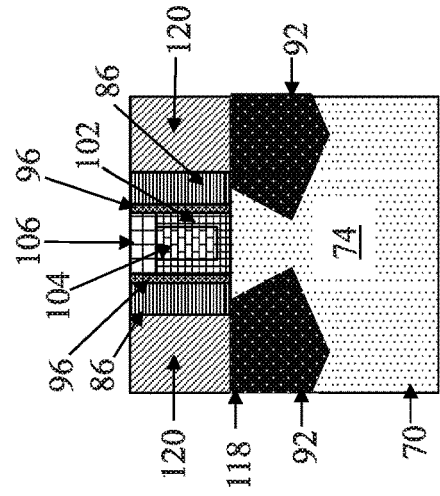
FIG. 14A  FIG. 14B  FIG. 14C
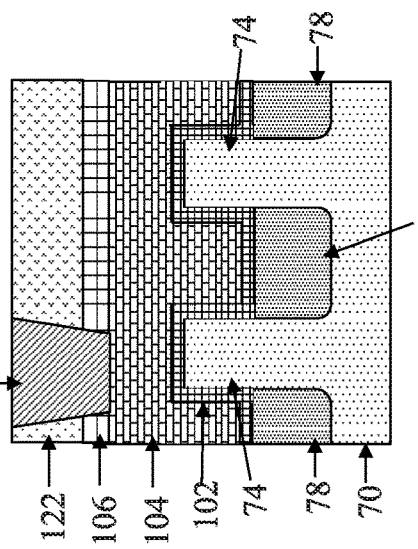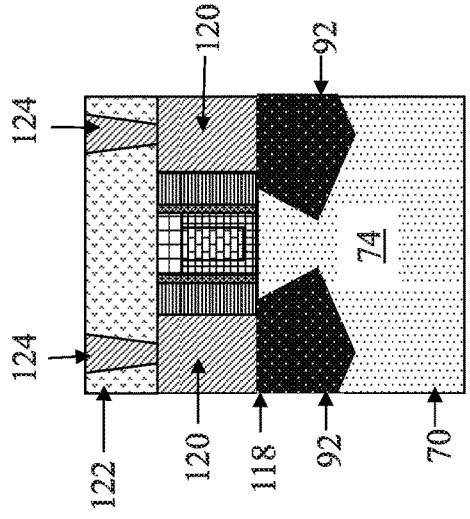
FIG. 15A  FIG. 15B  FIG. 15C

LOW-K GATE SPACER AND FORMATION THEREOF

PRIORITY CLAIM AND CROSS-REFERENCE

This application is a continuation of U.S. application Ser. No. 16/203,814, filed on Nov. 29, 2018, now U.S. Pat. No. 10,510,612, entitled "Low-k Gate Spacer and Formation Thereof," which is a divisional of U.S. application Ser. No. 15/833,912, filed on Dec. 6, 2017, now U.S. Pat. No. 10,483,168, entitled "Low-k Gate Spacer and Formation Thereof," which claims the benefit of and priority to U.S. Provisional Patent Application No. 62/586,529, filed on Nov. 15, 2017, entitled "Low-k Gate Spacer and Formation Thereof," each is incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. The reduced minimum feature size also typically results in higher device performance due to, for example, shorter distances electrical signals are carried.

Further, as semiconductor technologies have evolved, improved gate structures and processes for forming those gate structures have been created. One example of such improvement is the implementation of a metal gate electrode and various other layers, such as work-function tuning layers, into a gate structure. These improvements have led to further advancements in device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-C, 3A-C, 4A-C, 5A-C, 6A-C, 7A-C, 8A-C, 9A-C, 10A-C, 11A-C, 12A-C, 13A-C, 14A-C, and 15A-C are cross-sectional views of respective intermediate structures during intermediate stages in an example process of forming a gate structure with gate spacers in one or more FinFETs in accordance with some embodiments.

DETAILED DESCRIPTION

Figure 1:
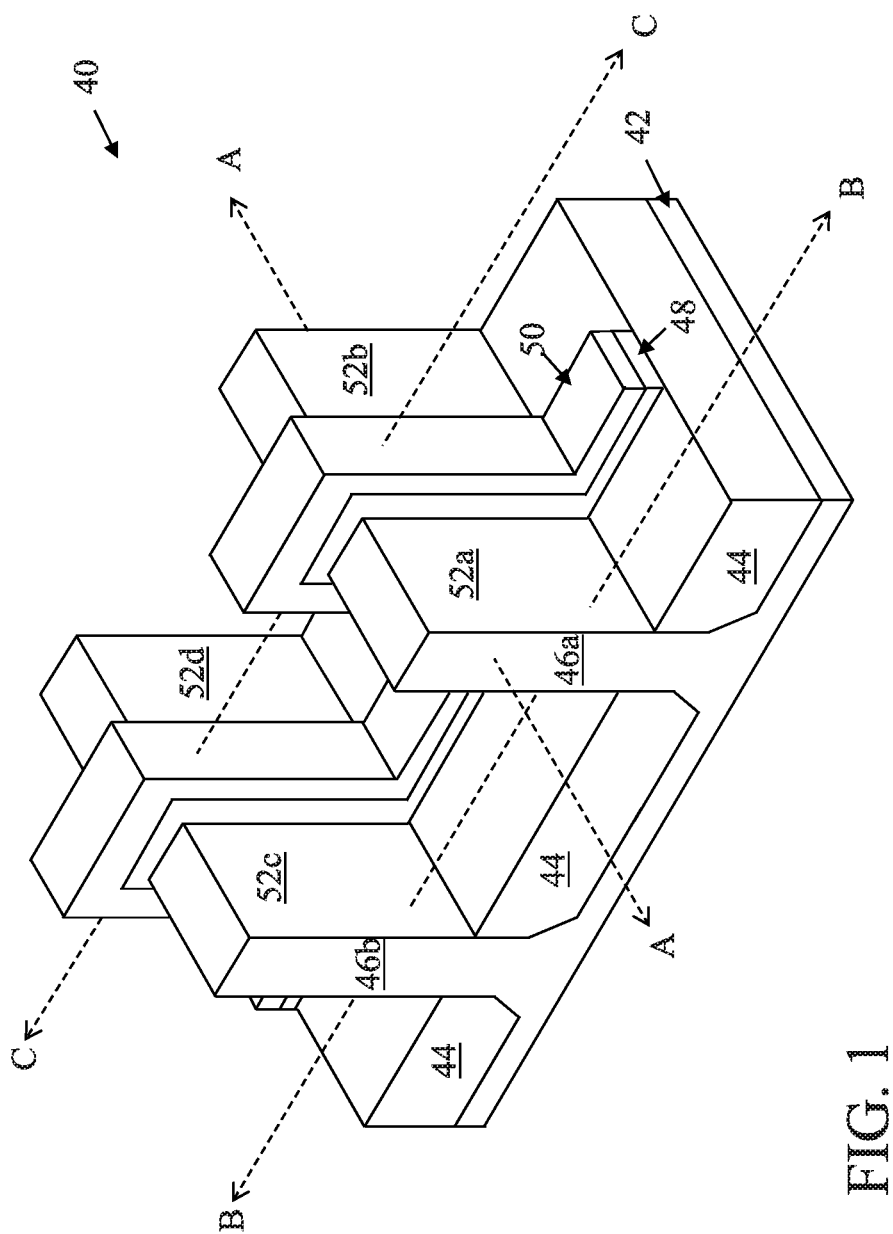
FIG. 1 is an example of simplified Fin Field Effect Transistors (FinFETs) in a three-dimensional view in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate structures and gate spacers of transistors, for example, and methods for forming such gate structures and gate spacers are described. Generally, in some examples, low-k gate spacers are formed after a dummy gate stack is removed in a replacement gate process. By forming the low-k gate spacers after the removal of a dummy gate stack, damage to the low-k gate spacers can be avoided in comparison to a process in which low-k gate spacers are formed before removing the dummy gate stack. Further, in some examples, the formation of the low-k gate spacers can be by a selective deposition process.

Example gate structures and gate spacers described and illustrated herein are implemented in Fin Field-Effect Transistors (FinFETs); however, gate structures and gate spacers within the scope of this disclosure may also be implemented in planar transistors and/or other semiconductor devices. Further, intermediate stages of forming FinFETs are illustrated. Some embodiments described herein are described in the context of FinFETs formed using a replacement gate process. In other examples, aspects of the present disclosure may be implemented in other processes. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps described herein.

FIG. 1 illustrates an example of simplified FinFETs 40 in a three-dimensional view. Other aspects not illustrated in or described with respect to FIG. 1 may become apparent from the following figures and description. The structure in FIG. 1 may be electrically connected or coupled in a manner to operate as, for example, one transistor or more, such as two transistors.

The FinFETs 40 comprise fins 46a and 46b on a substrate 42. The substrate 42 includes isolation regions 44, and the fins 46a and 46b each protrude above and from between neighboring isolation regions 44. Gate dielectric 48 is along sidewalls and over top surfaces of the fins 46a and 46b, and gate electrode 50 is over the gate dielectric 48. Source/drain regions 52a-d are disposed in respective regions of the fins 46a and 46b. Source/drain regions 52a and 52b are disposed in opposing regions of the fin 46a with respect to the gate dielectric 48 and gate electrode 50. Source/drain regions 52c and 52d are disposed in opposing regions of the fin 46b with respect to the gate dielectric 48 and gate electrode 50.

In some examples, two transistors may be implemented by: (1) source/drain regions 52a and 52b, gate dielectric 48, and gate electrode 50; and (2) source/drain regions 52c and 52d, gate dielectric 48, and gate electrode 50. Some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as one functional transistor. For example, if neighboring (e.g., as opposed to opposing) source/drain regions 52a-d are electrically connected, such as through coalescing the regions by epitaxial growth (e.g., source/drain regions 52a and 52c being coalesced, and source/drain regions 52b and 52d being coalesced), one functional transistor may be implemented. Other configurations in other examples may implement other numbers of functional transistors.

FIG. 1 further illustrates reference cross-sections that are used for later figures. Cross-section A-A is in a plane along, e.g., a channel in the fin 46a between opposing source/drain regions 52a and 52b. Cross-section B-B is in a plane perpendicular to cross-section A-A and is across the source/drain region 52a in the fin 46a and across the source/drain region 52c in the fin 46b. Cross-section C-C is in a plane perpendicular to cross-section A-A and is across the channel regions in the fins 46a and 46b and along the gate dielectric 48 and gate electrode 50. Subsequent figures refer to these reference cross-sections for clarity.

FIGS. 2A-C through 15A-C are cross-sectional views of respective intermediate structures during intermediate stages in an example process of forming a gate structure with gate spacers in, e.g., one or more FinFETs, in accordance with some embodiments. In FIGS. 2A-C through 15A-C, figures ending with an "A" designation illustrate cross-sectional views along a cross-section similar to cross-section A-A in FIG. 1; figures ending with a "B" designation illustrate cross-sectional views along a cross-section similar to cross-section B-B in FIG. 1; and figures ending with a "C" designation illustrate cross-sectional views along a cross-section similar to cross-section C-C in FIG. 1. In some figures, some reference numbers of components or features illustrated therein may be omitted to avoid obscuring other components or features; this is for ease of depicting the figures.

Figure 2A:
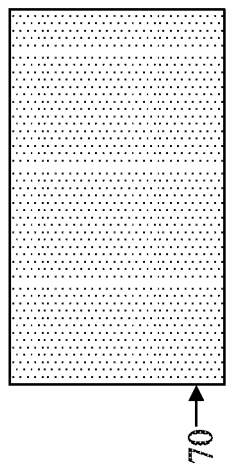
Figure 2B:
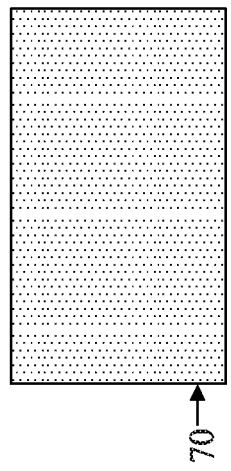
Figure 2C:
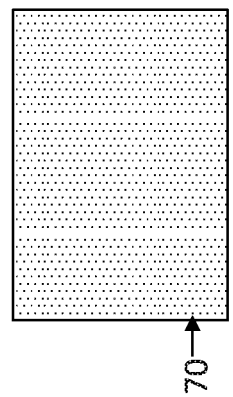

FIGS. 2A, 2B, and 2C illustrate a semiconductor substrate 70. The semiconductor substrate 70 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate layer may include silicon (Si); germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Figure 3A:
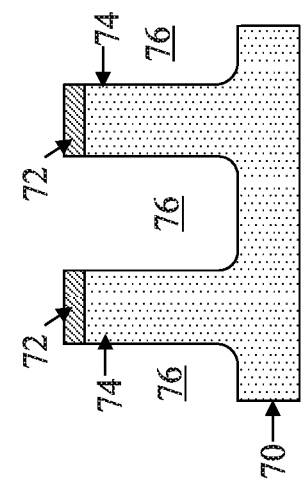
Figure 3B:
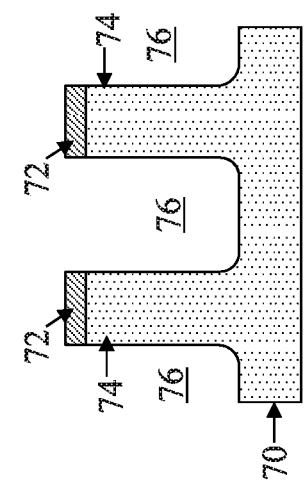
Figure 3C:
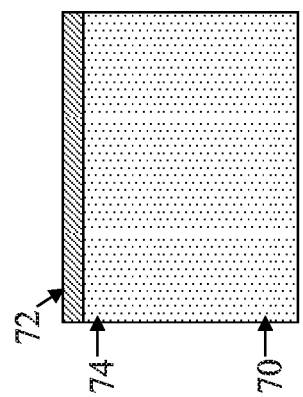

FIGS. 3A, 3B, and 3C illustrate the formation of fins 74 in the semiconductor substrate 70. In the illustrated example, a mask 72 (e.g., a hard mask) is used in forming the fins 74. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), the like, or a combination thereof. The etching may be anisotropic. Subsequently, the photo resist is removed in an ashing or wet strip processes, for example.

Using the mask 72, the semiconductor substrate 70 may be etched such that trenches 76 are formed between neighboring pairs of fins 74 and such that the fins 74 protrude from the semiconductor substrate 70. The etch process may include a RIE, NBE, the like, or a combination thereof. The etching may be anisotropic.

Figure 4A:
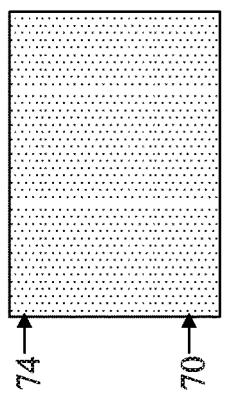
Figure 4B:
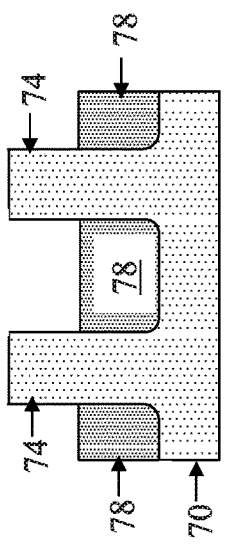
Figure 4C:
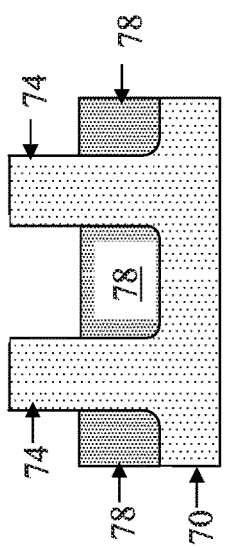

FIGS. 4A, 4B, and 4C illustrate the formation of isolation regions 78, each in a corresponding trench 76. The isolation regions 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 78 include silicon oxide that is formed by a FCVD process. A planarization process, such as a chemical mechanical polish (CMP), may remove any excess insulating material and any remaining mask 72 to form top surfaces of the insulating material and top surfaces of the fins 74 to be coplanar. The insulating material may then be recessed to form the isolation regions 78. The insulating material is recessed such that the fins 74 protrude from between neighboring isolation regions 78, which may, at least in part, thereby delineate the fins 74 as active areas on the semiconductor substrate 70. The insulating material may be recessed using an acceptable etching process, such as one that is selective to the material of the insulating material. For example, a chemical oxide removal using a CERTAS® etch or an Applied Materials SICONI® tool or dilute hydrofluoric (dHF) acid may be used. Further, top surfaces of the isolation regions 78 may have a flat surface as illustrated, a convex surface, a concave surface (such as dishing), or a combination thereof, which may result from an etch process.

A person having ordinary skill in the art will readily understand that the process described with respect to FIGS. 2A-C through 4A-C is just one example of how fins 74 may be formed. In other embodiments, a dielectric layer can be formed over a top surface of the semiconductor substrate 70;

trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 74 can be recessed (e.g., after planarizing the insulating material of the isolation regions 78 and before recessing the insulating material), and a material different from the fins may be epitaxially grown in their place. In an even further embodiment, a dielectric layer can be formed over a top surface of the semiconductor substrate 70; trenches can be etched through the dielectric layer; heteroepitaxial structures can be epitaxially grown in the trenches using a material different from the semiconductor substrate 70; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material in for a p-type device. In various embodiments, the fins 74 may comprise silicon, silicon germanium ($Si_xGe_{1-x}$, where x can be between approximately 0 and 100), silicon carbide, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like.

Figure 5A:
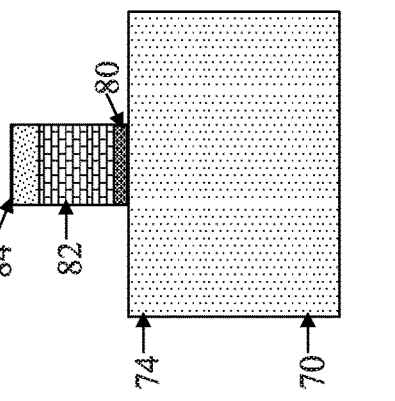
Figure 5B:
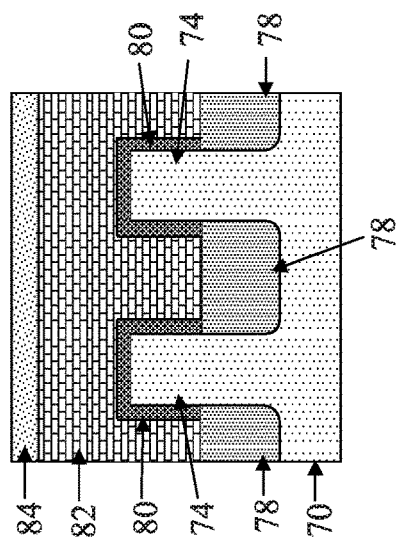
Figure 5C:
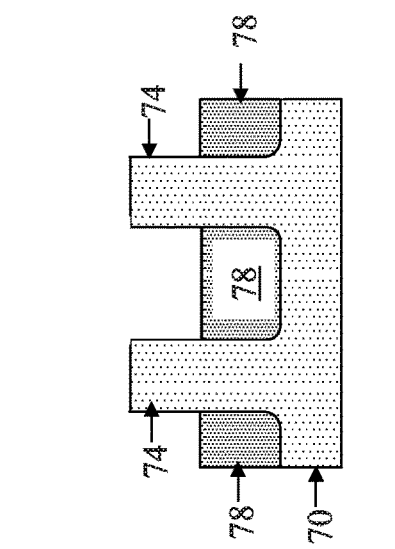

FIGS. 5A, 5B, and 5C illustrate the formation of a dummy gate stack on the fins 74. The dummy gate stack comprises an interfacial dielectric 80, a dummy gate 82, and a mask 84. The interfacial dielectric 80, dummy gate 82, and mask 84 may be formed by sequentially depositing respective layers and patterning those layers. For example, a layer for the interfacial dielectric 80 may include or be silicon oxide, silicon nitride, the like, or multilayers thereof, and may be thermally grown or deposited, such as by plasma-enhanced CVD (PECVD), ALD, or another deposition technique. A layer for the dummy gate 82 may include or be silicon (e.g., polysilicon) or another material deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, dummy gate 82, and interfacial dielectric 80 may then be patterned, for example, using photolithography and one or more etch processes, like described above with respect to FIGS. 3A-C, to form the mask 84, dummy gate 82, and interfacial dielectric 80 for the dummy gate stack.

FIGS. 6A, 6B, and 6C illustrate the formation of gate spacers 86. Gate spacers 86 are formed along sidewalls of the dummy gate stack (e.g., sidewalls of the interfacial dielectric 80, dummy gate 82, and mask 84). The gate spacers 86 may be formed by conformally depositing a layer for the gate spacers 86 and anisotropically etching the layer, for example. The layer for the gate spacers 86 may include or be silicon nitride, silicon carbon nitride, the like, multilayers thereof, or a combination thereof, and the etch process can include a RIE, NBE, or another etching process. Hence, the gate spacers 86 can have a dielectric constant (k) value that is greater than 4.2 (e.g., silicon nitride), such as greater than about 6.

FIGS. 7A, 7B, and 7C illustrate the formation of recesses 90 for source/drain regions. As illustrated, the recesses 90 are formed in the fins 74 on opposing sides of the dummy gate stack. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethyalammonium hydroxide (TMAH), ammonium hydroxide ($NH_4OH$), or another etchant.

FIGS. 8A, 8B, and 8C illustrate the formation of epitaxy source/drain regions 92 in the recesses 90. The epitaxy source/drain regions 92 may include or be silicon germanium ($Si_xGe_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 8A and 8B, due to blocking by the isolation regions 78, epitaxy source/drain regions 92 are first grown vertically in recesses 90, during which time the epitaxy source/drain regions 92 do not grow horizontally. After the recesses 90 are fully filled, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 7A-C and 8A-C may be omitted, and that source/drain regions may be formed by implanting dopants into the fins 74. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Example dopants can include or be, for example, boron for a p-type device and phosphorus or arsenic for an n-type device, although other dopants may be used. The epitaxy source/drain regions 92 (or other source/drain region) may have a dopant concentration in a range from about $10^{19}$ $cm^{-3}$ to about $10^{21}$ $cm^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

FIGS. 9A, 9B, and 9C illustrate the formation of one or more dielectric layers 100. The one or more dielectric layers 100 may include an etch stop layer (ESL) and an interlayer dielectric (ILD), for example. Generally, an etch stop layer can provide a mechanism to stop an etching process when forming, e.g., contacts or vias. An etch stop layer may be formed of a dielectric material having a different etch selectivity from adjacent layers, for example, the interlayer dielectric. The etch stop layer may be conformally deposited over the epitaxy source/drain regions 92, dummy gate stack, gate spacers 86, and isolation regions 78. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric may comprise or be silicon dioxide, a low-K dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The interlayer dielectric may be deposited by spin-on, CVD, FCVD, PECVD, PVD, or another deposition technique.

The one or more dielectric layers 100 are formed with top surface(s) coplanar with the top surface of the dummy gate 82. A planarization process, such as a CMP, may be performed to level the top surface of the one or more dielectric layers 100 with the top surface of the dummy gate 82. The CMP may also remove the mask 84 (and, in some instances, upper portions of the gate spacers 86) on the dummy gate 82. Accordingly, the top surface of the dummy gate 82 is exposed through the one or more dielectric layers 100.

FIGS. 10A, 10B, and 10C illustrate the removal of the dummy gate stack. The dummy gate stack can be removed by etching the dummy gate 82 and the interfacial dielectric 80. For example, a dry or wet etch process selective to the material of the dummy gate 82 may be performed to remove the dummy gate 82 (wherein the interfacial dielectric 80 may be used as an etch stop), and then, a dry or wet etch process selective to the material of the interfacial dielectric 80 may be performed to remove the interfacial dielectric 80. The removal of the dummy gate stack forms a recess 94 between the gate spacers 86.

FIGS. 11A, 11B, and 11C illustrate the formation of low-k gate spacers 96 along the sidewalls of the gate spacers 86 in the recess 94. The low-k gate spacers 96 are deposited using a selective deposition process. The selective deposition process deposits the low-k gate spacers 96 along the sidewalls of the gate spacers 86 but not on some other surfaces, such as surfaces of the fin 74. The low-k gate spacers 96 may be considered self-aligned along the sidewalls of the gate spacers 86. Additional details of the low-k gate spacers 96 and the selective deposition process are described with respect to FIGS. 16 through 21 subsequently.

FIGS. 12A, 12B, and 12C illustrate the formation of a replacement gate structure in the recess 94 between the low-k gate spacers 96. As illustrated, the replacement gate structure comprises a gate dielectric 102, gate electrode 104, and mask 106. In some examples, one or more work-function tuning layers may be disposed between the gate dielectric 102 and the gate electrode 104.

A layer for the gate dielectric 102 is formed in the recess 94. For example, the layer for the gate dielectric 102 can be conformally deposited, e.g., along sidewalls of the low-k gate spacers 96, top surfaces and sidewalls of the fins 74 exposed by the recess 94, and over the top surface of the one or more dielectric layers 100. The layer for the gate dielectric 102 can be or include silicon oxide, silicon nitride, a high-k dielectric material, multilayers thereof, or other dielectric material. A high-k dielectric material may have a dielectric constant (k) value greater than about 7.0, and may include a metal oxide of or a metal silicate of Hf, Al, Zr, La, Mg, Ba, Ti, Pb, or a combination thereof. The layer for the gate dielectric 102 can be deposited by ALD, PECVD, MBD, or another deposition technique.

If implemented, one or more work-function tuning layers may be formed over the layer for the gate dielectric 102. For example, the one or more work-function tuning layers can be conformally deposited on the layer for the gate dielectric 102. The one or more work-function tuning layers may be or comprise a metal-containing material such as TiN, TaN, TaC, multi-layers thereof, or a combination thereof. The layer for the one or more work-function tuning layers can be deposited by ALD, PECVD, MBD, or another deposition technique.

A layer for the gate electrode 104 is formed over the layer for the gate dielectric 102 (e.g., over any work-function tuning layer). The layer for the gate electrode 104 can fill a remaining region of the recess 94. The layer for the gate electrode 104 may be or comprise a metal-containing material such as Co, Ru, Al, multi-layers thereof, or a combination thereof. The layer for the gate electrode 104 can be deposited by ALD, PECVD, MBD, PVD, or another deposition technique.

Portions of the layers for the gate electrode 104, the gate dielectric 102, and any work-function tuning layer above the top surface of the one or more dielectric layers 100 are removed. For example, a planarization process, like a CMP, may remove the portions of the layers for the gate electrode 104 and the gate dielectric 102 above the top surface of the one or more dielectric layers 100. Subsequently, an etch-back may recess top surfaces of the gate electrode 104 and gate dielectric 102 to a level below the top surface of the one or more dielectric layers 100. The etch-back may be a RIE, wet etch, or another etch process, for example. The gate electrode 104 and gate dielectric 102 may therefore be formed as illustrated in FIG. 12A.

A layer for the mask 106 is formed over the gate electrode 104 and gate dielectric 102 (e.g., where the gate electrode 104 and gate dielectric 102 have been etched back) and over the one or more dielectric layers 100. The layer for the mask 106 may include or be silicon nitride, silicon oxynitride, silicon carbide, silicon carbon nitride, the like, or a combination thereof, and may be deposited by CVD, PVD, ALD, or another deposition technique. Portions of the layer for the mask 106 above the top surface of the one or more dielectric layers 100 are removed. For example, a planarization process, like a CMP, may remove the portions of the layer for mask 106 above the top surface of the one or more dielectric layers 100, and the top surface of the mask 106 may be formed coplanar with the top surface of the one or more dielectric layers 100.

FIGS. 13A, 13B, and 13C illustrate the formation of openings 110 through the one or more dielectric layers 100 to the epitaxy source/drain regions 92 to expose at least respective portions of the epitaxy source/drain regions 92. A mask 112 is formed on the one or more dielectric layers 100 and mask 106 for forming the openings 110. A layer for the mask 112 may include or be silicon nitride, silicon oxynitride, silicon carbon nitride, the like, or a combination thereof, deposited by CVD, PVD, ALD, or another deposition technique. The layer for the mask 112 may then be patterned, for example, using photolithography and one or more etch processes. Using the mask 112, the openings 110 can be formed through the one or more dielectric layers 100 using one or more etch processes, such as RIE, NBE, or another etch process.

FIGS. 14A, 14B, and 14C illustrate the formation of conductive features 120 in the openings 110 to the epitaxy source/drain regions 92. Each conductive feature 120, as described herein, includes a silicide region, a barrier layer, and a metal contact. In this example, a metal layer is conformally deposited in the openings 110, and the barrier layer is conformally deposited on the metal layer. Particularly, the metal layer is deposited on upper surfaces of the epitaxy source/drain regions 92 exposed by the openings 110, and along other surfaces of the openings 110. The metal layer may be or comprise, for example, titanium, cobalt, nickel, the like, or a combination thereof, and may be deposited by ALD, CVD, or another deposition technique. The barrier layer may be or comprise titanium nitride, titanium oxide, tantalum nitride, tantalum oxide, the like, or a combination thereof, and may be deposited by ALD, CVD, or another deposition technique.

Silicide regions may be formed on upper portions of the epitaxy source/drain regions 92. The silicide regions may be formed by reacting upper portions of the epitaxy source/drain regions 92 with the metal layer and/or barrier layer. An anneal is performed to facilitate the reaction of the epitaxy source/drain regions 92 with the metal layer and/or barrier layer. In some examples, an etch may be performed to remove unreacted portions of the metal layer and/or barrier layer.

Metal contacts filling the openings 110 may then be formed. The metal contacts may be or comprise tungsten, copper, aluminum, gold, silver, alloys thereof, the like, or a combination thereof, and may be deposited by CVD, ALD, PVD, or another deposition technique. After the material of the metal contacts is deposited, excess material may be removed by using a planarization process, such as a CMP, for example. The planarization process may remove excess material of the metal contacts, barrier layer, metal layer, and mask 112 from above the top surface of the one or more dielectric layers 100. Hence, top surfaces of the metal contacts, barrier layer, metal layer, and one or more dielectric layers 100 may be coplanar. Accordingly, conductive features including the metal contacts, barrier layer, metal layer, and/or silicide regions may be formed to the epitaxy source/drain regions 92.

Although the conductive features (e.g., including the metal contacts) are depicting as having a certain configuration in the figures, the conductive features can have any configuration. For example, separate conductive features may be formed to separate epitaxy source/drain regions 92. A person having ordinary skill in the art will readily understand modifications to process steps described herein to achieve different configurations.

FIGS. 15A, 15B, and 15C illustrate the formation of one or more dielectric layers 122 and conductive features 124 in the one or more dielectric layers 122. The one or more dielectric layers 122 may include an etch stop layer (ESL), and an interlayer dielectric (ILD) or intermetal dielectric (IMD), for example. The etch stop layer may be deposited over the one or more dielectric layers 100, conductive features 120, mask 106, etc. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric or intermetal dielectric may comprise or be silicon dioxide, a low-K dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The interlayer dielectric or intermetal dielectric may be deposited by spin-on, CVD, FCVD, PECVD, PVD, or another deposition technique.

Recesses and/or openings are formed in and/or through the one or more dielectric layers 122 where the conductive features 124 are to be formed. The one or more dielectric layers 122 may be patterned with the recesses and/or openings, for example, using photolithography and one or more etch processes. The conductive features 124 may then be formed in the recesses and/or openings. The conductive features 124 may include a barrier layer and conductive material formed on the barrier layer, for example. The barrier layer can be conformally deposited in the recesses and/or openings and over the one or more dielectric layers 122. The barrier layer may be or comprise titanium nitride, titanium oxide, tantalum nitride, tantalum oxide, the like, or a combination thereof, and may be deposited by ALD, CVD, or another deposition technique. The conductive material may be or comprise tungsten, copper, aluminum, gold, silver, alloys thereof, the like, or a combination thereof, and may be deposited by CVD, ALD, PVD, or another deposition technique. After the material of the conductive features 124 is deposited, excess material may be removed by using a planarization process, such as a CMP, for example. The planarization process may remove excess material of the conductive features 124 from above a top surface of the one or more dielectric layers 122. Hence, top surfaces of the conductive features 124 and the one or more dielectric layers 122 may be coplanar. The conductive features 124 may be or may be referred to as contacts, vias, conductive lines, etc.

FIGS. 16 through 21 illustrate cross-sectional views of portions of respective intermediate structures during intermediate stages of the example process of FIGS. 2A-C through 15A-C. More particularly, FIGS. 16 through 21 illustrate details of the selective deposition of the low-k gate spacers 96 and of the formation of the replacement gate structure generally described with respect to FIGS. 11A-C and 12A-C.

Figure 16:
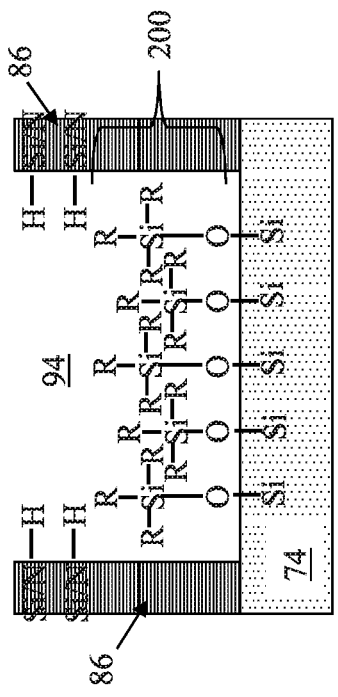
FIGS. 16 through 21 are cross-sectional views of portions of respective intermediate structures during intermediate stages in an example process of forming a gate structure with gate spacers in accordance with some embodiments.

FIG. 16 illustrates a portion of the intermediate structure after the dummy gate stack has been removed (e.g., like shown in FIG. 10A). In some examples, the surfaces of the fins 74 (e.g., silicon surfaces) are terminated with hydroxyl groups (OH), and the surfaces of the gate spacers 86 (e.g., silicon nitride surfaces) are terminated with hydrogen (H), as shown in FIG. 16. In some examples, to obtain the termination at the surfaces as illustrated in FIG. 16, an oxygen-based treatment is performed, and an etching process is performed following the oxygen-based treatment. The oxygen-based treatment can be or include an oxygen ($O_2$) ash, an oxygen ($O_2$) plasma, ozone ($O_3$) oxidation, hydrogen peroxide ($H_2O_2$) anneal, and/or another oxygen-based treatment. The etching process can be or include a dilute hydrofluoric (dHF) acid wet etch, an Applied Materials SICONI® etch, a CERTAS® dry etch (e.g., $NH_3$ and $NF_3$), and/or another etching process. The oxygen-based treatment can terminate the surfaces of the fins 74 and the gate spacers 86 with hydroxyl (OH) groups. In some examples, the bonds between the surfaces of the gate spacers 86 and the oxygen of the hydroxyl groups is weaker than the bonds between the surfaces of the fins 74 and the oxygen of the hydroxyl groups, and hence, the etching process may etch and remove oxygen at the surfaces of the gate spacers 86 while the hydroxyl groups remain at the surfaces of the fins 74. Hence, the surfaces of the fins 74 can be terminated with hydroxyl groups (OH), while the surfaces of the gate spacers 86 can be terminated with hydrogen (H). In other examples, the surfaces of the fins 74 and gate spacers 86 can be terminated with other species or functional groups, and/or can be terminated using another process.

Figure 17:
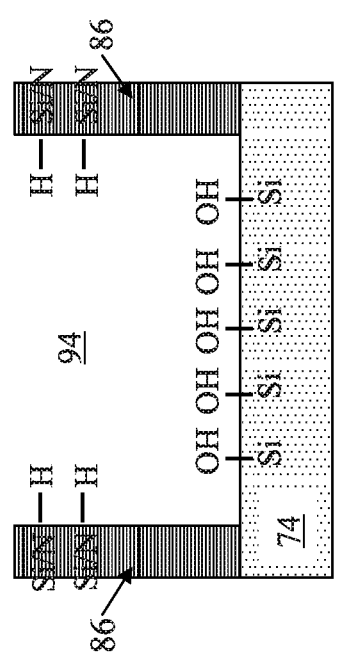

FIG. 17 illustrates the formation of an inhibitor layer 200 on the surfaces of the fins 74. The inhibitor layer 200 can be formed using a silylation process. A precursor may be exposed to the surfaces of the fins 74 to form the inhibitor layer 200. For example, the precursor may be exposed to the surfaces in an ALD chamber before exposing the structure to precursors to form the low-k gate spacers. The precursor may be or comprise a silicon-containing gas with one or more R-groups, such as three R-groups, and one or more L-groups (or Leaving groups), such as one L-group. Example R-groups include any of the alkyl series, such as —$CH_3$, —$C_2H_5$, etc., and other R-groups. Example L-groups include any functional group that includes a strong electron negativity element, such as with N element chemical materials like N-Trimethylsilylpyrrole, with halide like Octadecyltrichlorosilane (ODTS), and with Cl like trimethylchrolosilane (TMCS). Example precursor gases include N-Trimethylsilylpyrrole, Trimethylchrolosilane, and/or the like. The precursor gas reacts with the hydroxyl groups on the surfaces of the fins 74 such that the hydrogen of the hydroxyl group and the L-group of the precursor gas leave the surfaces as by-products and $SiOR_3$ molecules are formed at the surfaces of the fins 74 from the silicon and R-groups of the precursor gas and the oxygen from the hydroxyl group. The $SiOR_3$ molecules may form a self-aligned monolayer as the inhibitor layer 200 on the surfaces of the fins 74.

Figure 18:
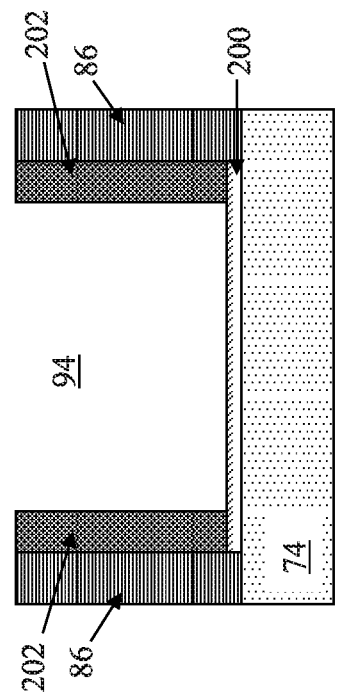

FIG. 18 illustrates the formation of the low-k gate spacers 202 (e.g., low-k gate spacers 96) after forming the inhibitor layer 200. The formation of the low-k gate spacers 202 can use an ALD process in the ALD chamber, for example. The ALD process can sequentially provide a first precursor flow for a first reactant A, purge the first precursor for the first reactant A, provide a second precursor flow for a second reactant B, and purge the second precursor for the second reactant B. These sequential steps may be repeated until the low-k gate spacers 202 achieve a desired thickness. The first reactant A may be capable of reacting with a material of the gate spacers 86 and not capable of substantially reacting with the material of the inhibitor layer 200. For example, the first reactant A of the first precursor may react with the hydrogen-terminated surfaces of the gate spacers 86 and not react significantly with the inhibitor layer 200. The second reactant B of the second precursor may then react with the atoms at the surfaces that reacted with the first reactant A.

Figure 19:
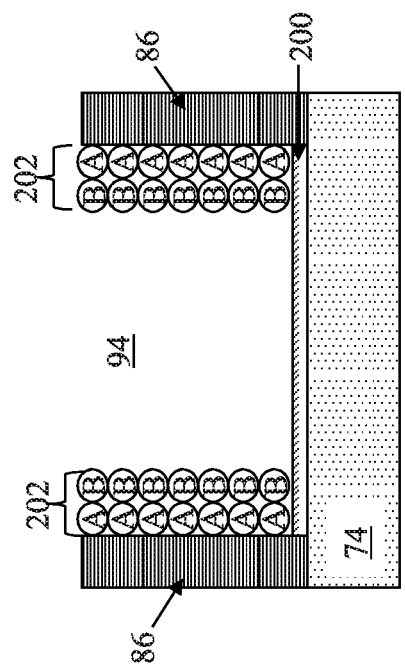

In some examples, the low-k gate spacers 202 are or include a carbon-containing material, such as OSG, $SiO_xC_y$, SiOCN, the like, or a combination thereof. Example first precursors include $SiH_2Cl_2$, $Si_2Cl_6$, $SiCl_4$, $SiCl_3H$, $SiBr_4$, $SiH_2I_2$, $SiF_4$, $SiI_4$, the like, and/or other precursors, and example second precursors include $O_2$, $H_2O$, $H_2O_2$, $O_3NH_3$, $N_2$, the like, and/or other precursors. In some examples, a thickness of the low-k gate spacers 202 (e.g., perpendicular to the corresponding sidewall of the gate spacer 86) is in a range from about 3 nm to about 8 nm. A dielectric constant (k) value of the low-k gate spacers 202 is less than a k-value of silicon oxide (SiO), such as less than 4.2, and more particularly, in some examples, a k-value of the low-k gate spacers 202 is equal to or less than about 3.9, such as in a range from about 3.5 to about 3.9. FIG. 19 illustrates the formed low-k gate spacers 202.

Figure 21:
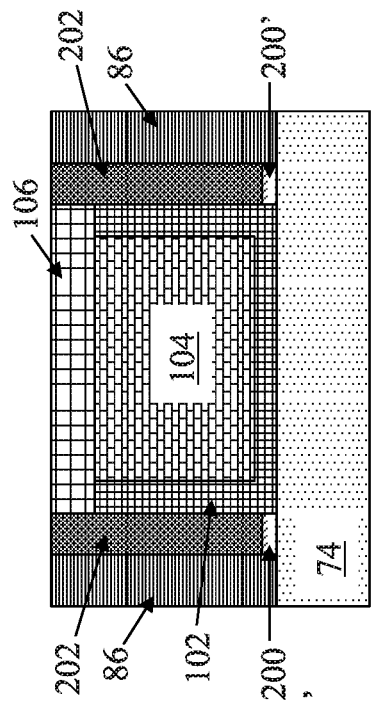
Figure 20:
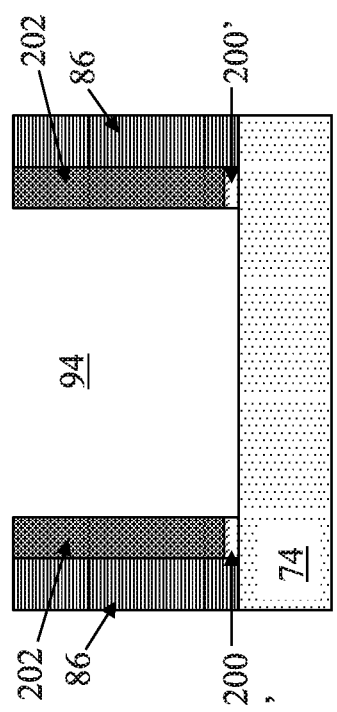

FIG. 20 illustrates the removal of at least a portion of the inhibitor layer 200. At least a portion of the inhibitor layer 200 exposed through the recess 94 (e.g., between the low-k gate spacers 202) is removed. The removal of the at least the portion of the inhibitor layer 200 can be performed using any appropriate process. In some examples, an oxygen ($O_2$) plasma treatment can be used to break the Si—R (e.g., Si—C) bonds in the inhibitor layer 200 and to create Si—O bonds, and then, a dHF or other dry etch, such as an isotropic etch, can be used to remove the oxidation layer that is created from treating the inhibitor layer 200 with the oxygen plasma. In other examples, a hydrogen ($H_2$) plasma can be used to break the Si—R (e.g., Si—C) bonds in the inhibitor layer 200 and to create Si—OH bonds, in effect, reducing the inhibitor layer 200. Some modified and/or unmodified portions 200' of the inhibitor layer 200 may remain under the low-k gate spacers 202. For example, the oxygen plasma treatment may likewise break the Si—R bonds in the portions 200' to create Si—O bonds (and hence, at least some of the portions 200' would be silicon oxide (e.g., $SiO_2$)), although in some examples, some of the portions 200' may retain some Si—R bonds. Further, the etch, in some instances, may not remove at least some of the modified and/or unmodified portions 200' under the low-k gate spacers 202. Other processes can be used to remove the inhibitor layer 200. FIG. 21 illustrates the formation of the replacement gate structure between the low-k gate spacers 202 in the recess 94, as described with respect to FIGS. 12A-C above.

Some embodiments may achieve advantages. For example, damage to the low-k gate spacers may be obviated in some implementations that use a replacement gate process. If a low-k gate spacer is formed before the dummy gate stack is removed, etch processes used to remove the dummy gate stack can deplete or consume carbon contained in the low-k gate spacer thereby damaging the low-k gate spacer. By depleting or consuming carbon from the low-k gate spacer, the k-value of the low-k gate spacer can be increased to the k-value of silicon oxide (e.g., 4.2) or above because the low-k gate spacer may be rendered silicon oxide or another high-k value material by the depletion or consumption of carbon, for example. Some implementations, however, avoid or mitigate the depletion or consumption of carbon from the low-k gate spacers by forming the low-k gate spacers after the dummy gate stack is removed. Hence, the low-k gate spacers in those implementations can retain carbon and a low k-value (e.g., in a range from about 3.5 to about 3.9). By retaining a low k-value, device performance can be increased.

Further, in some implementations, a critical dimension (e.g., width) of the dummy gate stack can be increased if the low-k gate spacers are formed after removal of the dummy gate stack. For example, the width of the dummy gate stack can be increased by approximately two times the thickness of a low-k gate spacer. This can help the dummy gate stack to become more robust, such as to avoid collapsing during processing. It can also increase a process window for various processes.

An embodiment is a structure. The structure includes an active area on a substrate, a gate structure on the active area and over the substrate, and a low-k gate spacer on the active area and along a sidewall of the gate structure. The gate structure includes a conformal gate dielectric on the active area and includes a gate electrode over the conformal gate dielectric. The conformal gate dielectric extends vertically along a first sidewall of the low-k gate spacer.

Another embodiment is a method. A dielectric surface is formed over an active area on a substrate. A low-k spacer is selectively deposited along the dielectric surface. After selectively depositing the low-k spacer, a gate structure is formed along the low-k spacer.

A further embodiment is a method. A dummy gate structure is formed on an active area on a substrate. First gate spacers are formed along respective sidewalls of the dummy gate structure. The dummy gate structure is removed, and removing the dummy gate structure forms a recess between the first gate spacers. Low-k gate spacers are formed along respective sidewalls of the first gate spacers interior to the recess. A replacement gate structure is formed between the low-k gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a fin protruding from a substrate;
    forming a dummy gate stack over the fin;
    forming a first spacer on the fin along a sidewall of the dummy gate stack;
    forming a dielectric layer over the fin along a first sidewall of the first spacer;
    removing the dummy gate stack exposing a second sidewall of the first spacer and a surface of the fin;
    terminating the surface of the fin with hydroxyl groups and the second sidewall of the first spacer with hydrogen;
    reacting the hydroxyl groups with a gas to form a self-aligned monolayer on the surface of the fin;
    selectively forming a second spacer along the second sidewall of the first spacer such that the second spacer does not cover the self-aligned monolayer;
    removing at least a portion of the self-aligned monolayer to expose the fin;
    forming a gate dielectric over the fin and sidewalls of the second spacer; and
    forming a gate electrode over the gate dielectric.

2. The method of claim 1, wherein terminating is performed at least in part by an oxygen treatment.

3. The method of claim 2, wherein the oxygen treatment comprises an oxygen ash, an oxygen plasma, or ozone oxidation, hydrogen peroxide anneal.

4. The method of claim 3, wherein the terminating comprises an etching process after the oxygen treatment.

5. The method of claim 4, wherein the etching process comprises a dilute hydrofluoric (dHF) acid wet etch.

6. The method of claim 1, wherein the gas comprises a silicon-containing gas with one or more alkyl groups (R-groups) and one or more leaving groups (L-groups).

7. The method of claim 6, wherein the self-aligned monolayer comprises a carbon-containing layer.

8. The method of claim 1, wherein the self-aligned monolayer comprises $SiOR_3$, wherein R represents an alkyl-group.

9. A method of forming a semiconductor device, the method comprising:
    forming a fin protruding from a substrate, the fin comprising a semiconductor material;
    forming first spacers over the fin, wherein the first spacers form a recess between the first spacers, the first spacers comprising a dielectric material;
    terminating a surface of the fin between the first spacers with hydroxyl groups;
    selectively forming a self-aligned monolayer on the surface of the fin, the self-aligned monolayer not extending from a top surface of the fin to a top surface of the first spacers;
    selectively forming second spacers along sidewalls of the first spacers in the recess, the self-aligned monolayer preventing the second spacers from covering the self-aligned monolayer along a bottom of the recess;
    removing at least a first portion of the self-aligned monolayer to expose the fin;
    forming a gate dielectric over the fin and sidewalls of the second spacers; and
    forming a gate electrode over the gate dielectric.

10. The method of claim 9, wherein, after removing at least the first portion of the self-aligned monolayer, a second portion of the self-aligned monolayer remains between the second spacers and the fin.

11. The method of claim 9, wherein removing at least the first portion comprises:
    performing an oxygen plasma treatment; and
    after performing the oxygen plasma treatment, performing a dry etch process.

12. The method of claim 9, wherein removing at least the first portion comprises:
    performing a hydrogen plasma treatment.

13. The method of claim 9, wherein selectively forming the second spacers comprises an atomic-layer deposition (ALD) process, wherein the ALD process comprises introducing a first gas, wherein the first gas reacts with a surface of the first spacers.

14. The method of claim 13, wherein the first gas comprises $SiH_2Cl_2$, $Si_2Cl_6$, $SiCl_4$, $SiCl_3H$, $SiBr_4$, $SiH_2I_2$, $SiF_4$, or $SiI_4$.

15. The method of claim 9, wherein the first spacers comprise a first dielectric material having a dielectric constant of greater than or equal to 4.2, and wherein the second spacers comprise a second dielectric material having a dielectric constant less than or equal to 3.9.

16. A method of forming a semiconductor device, the method comprising:
    forming a first dielectric layer over a semiconductor fin;
    terminating a first surface of the first dielectric layer and a second surface of the semiconductor fin with a first species;
    performing an etching process, wherein the etching process removes the first species on the first surface of the first dielectric layer, wherein the first species remains on the second surface;
    performing a silylation process to form an inhibitor layer, wherein the silylation process reacts with the first species on the second surface, the silylation process not reacting with the first surface of the first dielectric layer; and
    depositing a second dielectric layer on the first dielectric layer, depositing the second dielectric layer comprises introducing a first gas, the first gas reacting with the first surface but not the inhibitor layer.

17. The method of claim 16, wherein terminating is performed at least in part by an oxygen-based treatment.

18. The method of claim 16 further comprising removing a portion of the inhibitor layer using an oxygen plasma treatment.

19. The method of claim 16 further comprising removing a portion of the inhibitor layer using a hydrogen plasma treatment.

20. The method of claim 16, wherein the first dielectric layer has a higher dielectric constant than the second dielectric layer.

\* \* \* \* \*